(12) United States Patent
Tani et al.

(10) Patent No.: US 9,614,350 B2
(45) Date of Patent: Apr. 4, 2017

(54) SEMICONDUCTOR LASER ELEMENT AND NEAR-FIELD LIGHT OUTPUT DEVICE USING SAME

(71) Applicant: Sharp Kabushiki Kaisha, Osaka (JP)

(72) Inventors: Kentaroh Tani, Osaka (JP); Toshiyuki Kawakami, Osaka (JP); Akira Ariyoshi, Osaka (JP)

(73) Assignee: SHARP KABUSHIKI KAISHA, Osaka-shi (JP)

( * ) Notice: Subject to any disclaimer, the term of this patent is extended or adjusted under 35 U.S.C. 154(b) by 0 days.

(21) Appl. No.: 15/037,552

(22) PCT Filed: Aug. 27, 2014

(86) PCT No.: PCT/JP2014/072414
§ 371 (c)(1),
(2) Date: May 18, 2016

(87) PCT Pub. No.: WO2015/075988
PCT Pub. Date: May 28, 2015

(65) Prior Publication Data
US 2016/0322780 A1  Nov. 3, 2016

(30) Foreign Application Priority Data
Nov. 21, 2013  (JP) .................. 2013-240971

(51) Int. Cl.
*H01S 5/00* (2006.01)
*H01S 5/028* (2006.01)
(Continued)

(52) U.S. Cl.
CPC ............ *H01S 5/028* (2013.01); *H01S 5/0208* (2013.01); *H01S 5/02256* (2013.01);
(Continued)

(58) Field of Classification Search
CPC .... H01S 5/028; H01S 5/02256; H01S 5/0208; H01S 5/22; H01S 5/045; H01S 5/042
See application file for complete search history.

(56) References Cited

U.S. PATENT DOCUMENTS 5,636,070 A * 6/1997 Ji ...................... G02B 26/0858
                                                          29/25.35
7,884,010 B2   2/2011 Tatsumi et al.
(Continued)

FOREIGN PATENT DOCUMENTS

CN   101728357   6/2010
CN   102314885   1/2012
(Continued)

OTHER PUBLICATIONS

International Search Report mailed Nov. 25, 2014, directed to International Application No. PCT/JP2014/072414, 5 pages.

*Primary Examiner* — Kinam Park
(74) *Attorney, Agent, or Firm* — Morrison & Foerster LLP

(57) ABSTRACT

A semiconductor laser element is provided with: a substrate formed of a semiconductor; a semiconductor laminated film, which is laminated on the substrate, and which includes an active layer; a first electrode and a second electrode, which are provided on surfaces parallel to the active layer on the side where the semiconductor laminated film is formed on the substrate; and a facet protection film that is provided on both the facets, which are perpendicular to the active layer, and which face each other. In the semiconductor laser element, the facet is used as a fixing surface for the semiconductor laser element, said facet having the facet protection film formed thereon.

14 Claims, 9 Drawing Sheets

(51) Int. Cl.
    *H01S 5/042*     (2006.01)
    *H01S 5/022*     (2006.01)
    *H01S 5/22*     (2006.01)
    *H01S 5/02*     (2006.01)
    *H01S 5/16*     (2006.01)

(52) U.S. Cl.
    CPC ............ *H01S 5/042* (2013.01); *H01S 5/0425* (2013.01); *H01S 5/22* (2013.01); *H01S 5/162* (2013.01)

(56) References Cited

U.S. PATENT DOCUMENTS

| | | |
|---|---|---|
| 8,406,091 B2 | 3/2013 | Shimazawa et al. |
| 2003/0156240 A1* | 8/2003 | Oda .................. G02F 1/133553 349/113 |
| 2005/0190416 A1 | 9/2005 | Yoneda |
| 2010/0096755 A1 | 4/2010 | Tatsumi et al. |
| 2012/0008470 A1* | 1/2012 | Shimazawa ............ G11B 5/314 369/13.24 |

FOREIGN PATENT DOCUMENTS

| | | |
|---|---|---|
| JP | 61-84086 | 4/1986 |
| JP | 2001-42373 | 2/2001 |
| JP | 2002-335053 | 11/2002 |
| JP | 2012-18747 | 1/2012 |
| JP | 2012-156347 | 8/2012 |

* cited by examiner

SEMICONDUCTOR LASER ELEMENT AND NEAR-FIELD LIGHT OUTPUT DEVICE USING SAME

CROSS-REFERENCE TO RELATED APPLICATIONS

This application is a U.S. National Phase patent application of International Patent Application No. PCT/JP2014/072414, filed on Aug. 27, 2014, which claims priority to Japanese Application No. 2013-240971, filed on Nov. 21, 2013, each of which is hereby incorporated by reference in the present disclosure in its entirety.

FIELD OF THE INVENTION

The present invention relates to a semiconductor laser element having a two-electrode-at-one-side structure, and a near-field light output device using the same.

BACKGROUND OF THE INVENTION

Recently, in the fields of laser processing and large capacity storage, near-field light has come to be used to achieve microfabrication and high-density recording, etc., which have conventionally been impossible due to light diffraction limit. A near-field light output device configured to output near-field light directs laser light to an optical waveguide where a near-field light generating element is disposed, and outputs near-field light generated by the near-field light generating element to irradiate a desired area with the near-field light.

In thermally-assisted magnetic recording in which high-density recording is performed by using near-field light, a magnetic recording medium made of a magnetic material having a large magnetically anisotropic energy is used for a more stable magnetization. And a portion of the magnetic recording medium where data is to be written is heated by using the near-field light, to thereby reduce the anisotropic magnetic field of the portion, and immediately thereafter, a writing magnetic field is applied to the portion, and thereby minute-size writing is performed.

A conventional thermally-assisted magnetic recording head is disclosed in Patent Literature 1 listed below. FIG. 14 is a schematic front view of, and FIG. 15 is a perspective view showing a principal portion of, the conventional thermally-assisted magnetic recording head. The thermally-assisted magnetic recording head 1, which includes a slider 10 and a semiconductor laser element 40, is located over a magnetic disk D.

The slider 10 floats above the magnetic disk D while the magnetic disk D is rotating, and a magnetic recording portion 13 and a magnetic reproducing portion 14 are formed at one end portion of the slider 10 facing the magnetic disk D. An optical waveguide 15 is formed near the magnetic recording portion 13, and inside the optical waveguide 15, there is provided a near-field light generating element (not shown) that generates near-field light. On a mounting surface 10a on a rear surface side (opposite from the magnetic disk D) of the slider 10, terminals 17 and 18 for supplying power are each formed as a pattern.

The semiconductor laser element 40 has a semiconductor laminated film 42 which is formed on the substrate 41, and has an optical waveguide 46 which is formed in a shape of a stripe by a ridge portion 49 which is formed at an upper portion of the semiconductor laminated film 42. A first electrode 47 is formed on a bottom surface of the substrate 41, and a second electrode (not shown) is formed on an upper surface of the semiconductor laminated film 42.

The second electrode of the semiconductor laser element 40 is bonded, via a solder material 29, to a terminal surface 21b of a submount 21 where a terminal portion 22 is formed. A front surface 21a of the submount 21 that is perpendicular to the terminal surface 21b of the submount 21 is fixed to the mounting surface 10a of the slider 10 via a fixing member 19 such as an adhesive. At this time, an emission portion 46a of the optical waveguide 46 formed at a facet thereof is disposed to face the optical waveguide 15 of the slider 10.

The first electrode 47 is connected to the terminal 17 via a lead wire 7, and the terminal portion 22 is connected to the terminal 18 via a lead wire 8. Since the first electrode 47 and the terminal portion 22 are disposed to face the same direction (leftward direction in FIG. 14), the lead wires 7 and 8 are able to be connected easily.

When a voltage is applied between the first electrode 47 and the terminal portion 22, laser light is outputted through the emission portion 46a. The laser light outputted through the emission portion 46a is guided through the optical waveguide 15 of the slider 10 to reach the near-field light generating element, and causes the near-field light generating element to generate near-field light. The anisotropic magnetic field of the magnetic disk D is locally lowered due to heat from the near-field light outputted through the optical waveguide 15, and magnetic recording is performed on the magnetic disk D by the magnetic recording portion 13. As for data recorded on the magnetic disk D, it is read by the magnetic reproducing portion 14.

Heat generated in the semiconductor laser element 40 is transferred to the submount 21 via the solder material 29, to be then transferred to the slider 10 via the fixing member 19. Thereby, the heat generated in the semiconductor laser element 40 is dissipated through the submount 21 and the slider 10.

[Patent Literature 1] JP-A-2012-18747 (pages 7 to 22, FIG. 2)

SUMMARY OF THE INVENTION

According to the above-described conventional thermally-assisted magnetic recording head 1, the submount 21 having the semiconductor laser element 40 bonded to the terminal surface 21b thereof is bonded to the slider 10. At this time, if the emission portion 46a of the semiconductor laser element 40 protrudes over the front surface 21a of the submount 21 in direction Z as shown in FIG. 16, it will cause a poor connection. That is, the semiconductor laser element 40 collides against the slider 10, and this makes it impossible to bond the submount 21 to the slider 10.

If, as shown in FIG. 17, the front surface 21a of the submount 21 protrudes by a large amount with respect to the emission portion 46a of the semiconductor laser element 40 in direction Z, it will also cause a poor connection. That is, laser light L outputted through the emission portion 46a is diffused, and as a result, less laser light L enters the optical waveguide 15 (see FIG. 14) of the slider 10. If output of laser light from the semiconductor laser element 40 is increased to overcome such reduction of laser light L, it increases amount of load on the semiconductor laser element 40, which leads to degraded reliability of the semiconductor laser element 40. In addition, more heat is generated in the semiconductor laser element 40, and as a result, thermal distortion is caused, which changes a refractive index of the optical waveguide 15 of the slider 10, and this makes it impossible to obtain desired near-field light.

If the semiconductor laser element 40 is inclined in a plane parallel to the terminal surface 21b or in a plane perpendicular to the front surface 21a and the terminal surface 21b, for example, it makes it difficult to align the emission portion 46a with the optical waveguide 15.

Thus, it is necessary to align the semiconductor laser element 40 with respect to the submount 21 with high accuracy (for example, with positional accuracy in direction Z of ±1 to 2 μm). This causes problems of increased man-hours and reduced yield of the thermally-assisted magnetic recording head 1.

Furthermore, these problems are not specific only to the thermally-assisted magnetic recording head 1, but near-field light output devices having the semiconductor laser element 40 provided on an optical member having a near-field light generating element disposed in an optical waveguide also suffer from the same problems of increased man-hours and reduced yield.

An object of the present invention is to provide a near-field light output device capable of reducing man-hours and improving yield, and a semiconductor laser element for use in such a near-field light output device.

To achieve the above object, according to one aspect of the present invention, a semiconductor laser element includes a substrate formed of a semiconductor, a semiconductor laminated film that is laid on the substrate and includes an active layer, a first electrode and a second electrode that are provided on a surface parallel to the active layer, at a side where the semiconductor laminated film is formed on the substrate, and a facet protection film that is provided on each of two facets which are located opposite to each other and which are both perpendicular to the active layer. Here, one of the facets on each of which the facet protection film is formed is used as a fixing surface of the semiconductor laser element.

According to the present invention, in the semiconductor laser element configured as described above, a conductive film may be disposed on the fixing surface.

According to the present invention, in the semiconductor laser element configured as described above, the conductive film may be formed by stacking in order a base layer, a barrier layer, and a reaction layer.

According to the present invention, in the semiconductor laser element configured as described above, the base layer may be formed of Pt, Ti, Ni, Co, Cr, Pd, or Zr, the barrier layer may be formed of Pt, Ti, Ta, or W, and the reaction layer may be formed of Au.

According to the present invention, in the semiconductor laser element configured as described above, an oscillation wavelength may be 650 nm to 110 nm.

According to the present invention, in the semiconductor laser element configured as described above, the substrate may have a thickness that is equal to or greater than half a length between the two facets, or a thickness that is equal to or greater than 150 μm.

According to the present invention, in the semiconductor laser element configured as described above, the semiconductor laminated film may be formed by stacking in order a first conductive semiconductor layer, the active layer, and a second conductive semiconductor layer, and an insulating film and the conductive film may be stacked on the substrate.

According to the present invention, in the semiconductor laser element configured as described above, the substrate may be a semi-insulating substrate.

According to the present invention, in the semiconductor laser element configured as described above, the semi-insulating substrate may be formed of non-doped GaAs or Si.

According to the present invention, in the semiconductor laser element configured as described above, an insulating layer may be disposed between the substrate and the first conductive semiconductor layer.

According to the present invention, in the semiconductor laser element configured as described above, the insulating layer may be formed of a non-doped semiconductor.

According to the present invention, in the semiconductor laser element configured as described above, the insulating layer may be formed of a laminated film formed by alternately stacking an n-type semiconductor and a p-type semiconductor.

According to the present invention, in the semiconductor laser element configured as described above, the insulating layer may be made of a laminated film formed by alternately stacking a semi-insulating semiconductor and either an n-type semiconductor or a p-type semiconductor.

According to the present invention, in the semiconductor laser element configured as described above, the insulating layer may be made of a laminated film formed by alternately stacking an n-type semiconductor, a semi-insulating semiconductor, and a p-type semiconductor.

According to the present invention, in the semiconductor laser element configured as described above, the insulating film may be formed of the facet protection film.

According to the present invention, in the semiconductor laser element configured as described above, the insulating film may be a single-layer film selected from an Si oxide film, an Al oxide film, a Ta oxide film, a Ti oxide film, a Zr oxide film, a Ga oxide film, an Si nitride film, an Al nitride film, a Ta nitride film, a Ti nitride film, a Zr nitride film, and a Ga nitride film, or the insulating film may be a multilayered film formed of films selected from these films.

According to another aspect of the present invention, a near-field light output device includes any one of the above-configured semiconductor laser elements and an optical member having a near-field light generating element that generates near-field light. Here, the fixing surface is fixed on the optical member.

According to the present invention, in the near-field light output device configured as described above, the fixing surface and the optical member are bonded to each other by soldering or with an adhesive.

According to the present invention, in the near-field light output device configured as described above, the optical member may have a magnetic recording portion that is disposed facing a magnetic recording medium and configured to perform magnetic recording on a near-field light irradiation region of the magnetic recording medium.

According to the present invention, a semiconductor laser element includes a first electrode and a second electrode that are disposed on one side with respect to a substrate, and one of two opposing surfaces perpendicular to an active layer is used as a fixing surface of the semiconductor laser element. Thereby, a near-field light output device is formed by fixing the semiconductor laser element to an optical member having a near-field light generating element without interposing a submount or a heat sink therebetween. This facilitates alignment of the optical member and the semiconductor laser element, helps reduce the man-hours of the near-field light output device, and helps improve the yield of the near-field light output device. This also helps achieve reduction of thermal resistance through reduction of connection surfaces.

DETAILED DESCRIPTION OF THE INVENTION

Figure 14:
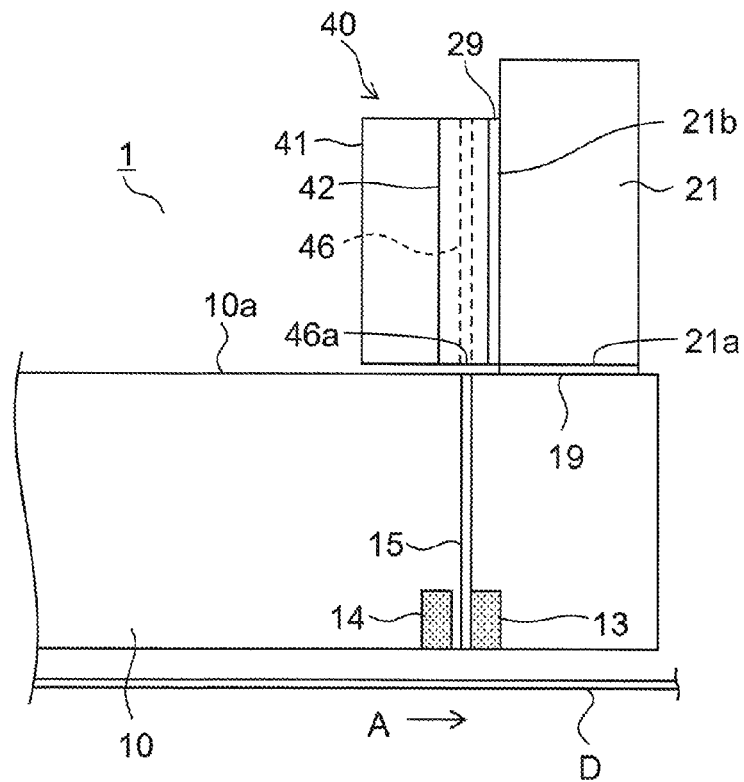
FIG. 14 is a schematic front view showing a conventional thermally-assisted magnetic recording head.
Figure 15:
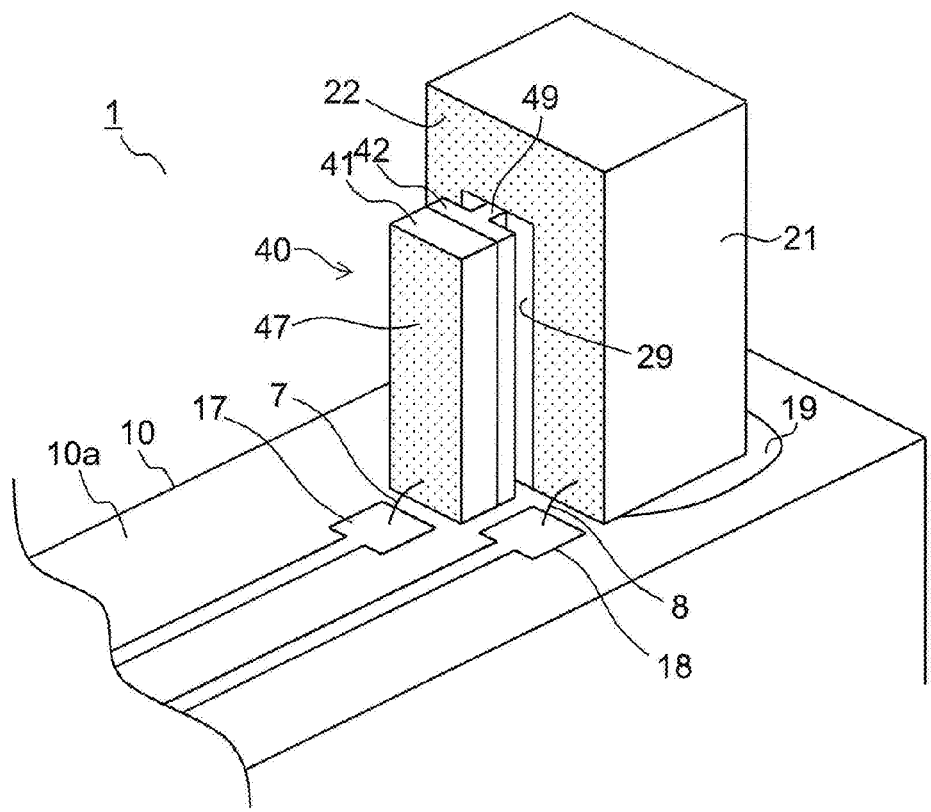
FIG. 15 is a perspective view showing a principal portion of the conventional thermally-assisted magnetic recording head.
Figure 16:
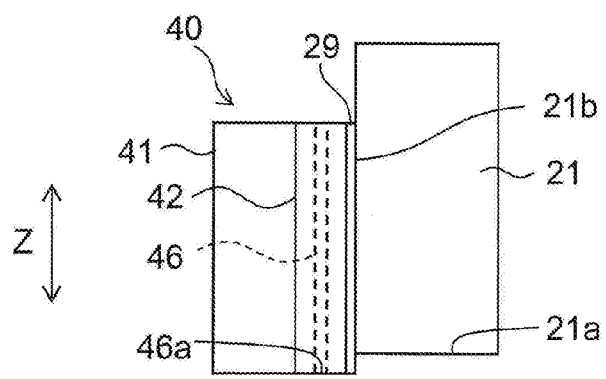
FIG. 16 is a front view showing poor connection of a semiconductor laser element of the conventional thermally-assisted magnetic recording head.
Figure 17:
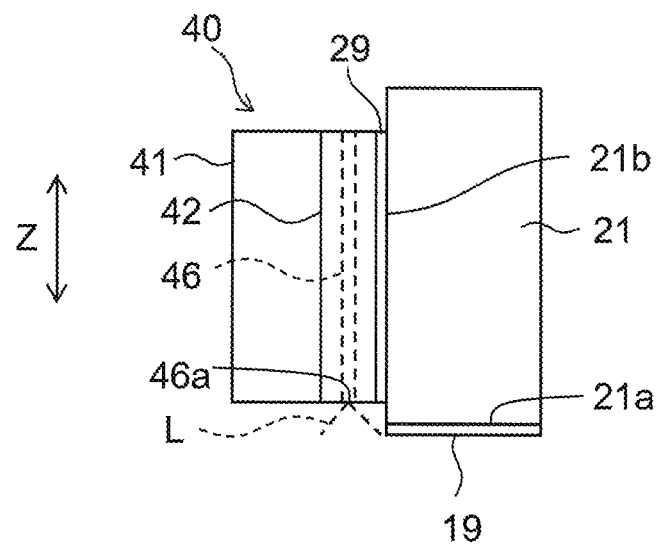
FIG. 17 is a front view showing poor connection of the semiconductor laser element of the conventional thermally-assisted magnetic recording head.

With reference to the accompanying drawings, embodiments of the present invention will be described below. For convenience of description, in the drawings referred to below, such portions as find their counter parts in the conventional example shown in FIG. 14 and FIG. 15 referred to above are denoted by common reference signs.

Figure 1:
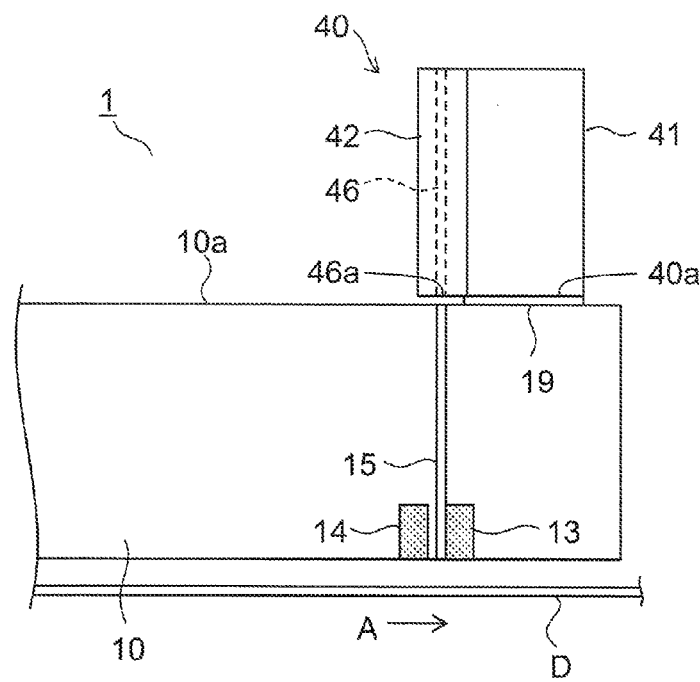
FIG. 1 is a schematic front view showing a thermally-assisted magnetic recording head of a first embodiment of the present invention.
Figure 2:
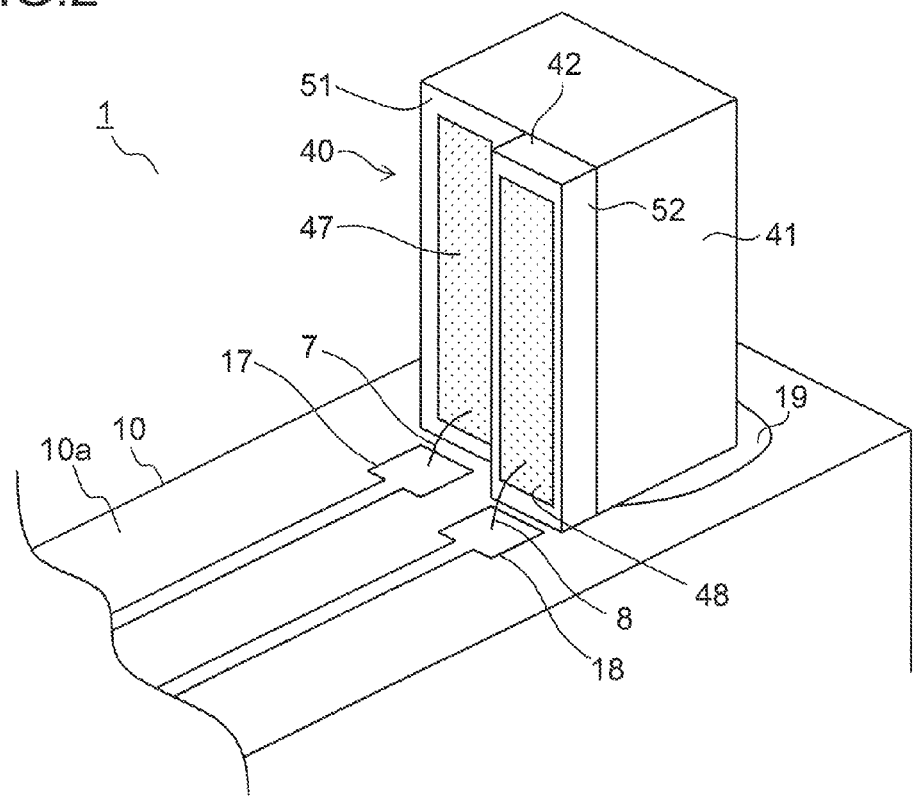
FIG. 2 is a perspective view showing a principal portion of the thermally-assisted magnetic recording head of the first embodiment of the present invention.

FIGS. 1 and 2 are respectively a schematic front view of, and a perspective view showing a principal portion of, a thermally-assisted magnetic recording head as a near-field light output device of a first embodiment of the present invention.

A thermally-assisted magnetic recording head 1 is mounted in an HDD unit, for example, and is disposed by being supported by a suspension (not shown) so as to be movable in an axial direction over a magnetic disk D. The thermally-assisted magnetic recording head 1 includes a slider 10 (an optical member) which faces the magnetic disk D, and a semiconductor laser element 40 which is fixed to the slider 10 by a fixing member 19. A conductive adhesive such as silver paste may be adopted as the fixing member 19, but for stronger connection, it is more desirable to adopt solder such as AuSn, which is applied to a later-described conductive film 56 (see FIG. 4).

The slider 10 floats over the magnetic disk D which rotates in direction A, and has a magnetic recording portion 13 and a magnetic reproducing portion 14 at a medium-withdrawal-side end portion of the slider 10. The magnetic recording portion 13 performs magnetic recording, and the magnetic reproducing portion 14 detects magnetization of the magnetic disk D and outputs a signal.

Near the magnetic recording portion 13, an optical waveguide 15 is disposed which guides laser light outputted from the semiconductor laser element 40. In the optical waveguide 15, there is disposed a near-field light generating element (not shown) which generates near-field light. On a mounting surface 10a on a rear surface side (a side opposite to the magnetic disk D) of the slider 10, terminals 17 and 18 for supplying power are pattern-formed.

As will be later described in detail, in the semiconductor laser element 40, a stripe-shaped optical waveguide 46 is formed by a ridge portion 49 (see FIG. 3) provided at a semiconductor laminated film 42 on a substrate 41. The semiconductor laser element 40 has an emission surface 40a which is perpendicular to the optical waveguide 46, and the emission surface 40a is fixed to the mounting surface 10a of the slider 10 via the fixing member 19. At this time, an emission portion 46a formed at a facet of the optical waveguide 46 is disposed to face the optical waveguide 15 of the slider 10. Since the submount 21 as shown in the conventional example (see FIG. 14) is omitted, it is possible to make the thermally-assisted magnetic recording head 1 lighter in weight.

The semiconductor laser element 40 has the semiconductor laminated film 42 laid on the substrate 41. On the substrate 41, there are formed a light emission portion 52 having an optical waveguide 46 and a dug-down portion 51 adjacent to the light emission portion 52. The dug-down portion 51 is formed by digging the semiconductor laminated film 42 down to a predetermined position by etching. A first electrode 47 is provided at the dug-down portion 51 and a second electrode 48 is provided at the light emission portion 52.

The first electrode 47 is connected to a terminal 17 via a lead wire 7, and the second electrode 48 is connected to a terminal 18 via a lead wire 8. The first electrode 47 and the second electrode 48 are disposed facing the same direction (leftward in FIG. 1), and this facilitates connection of the lead wires 7 and 8.

Figure 3:
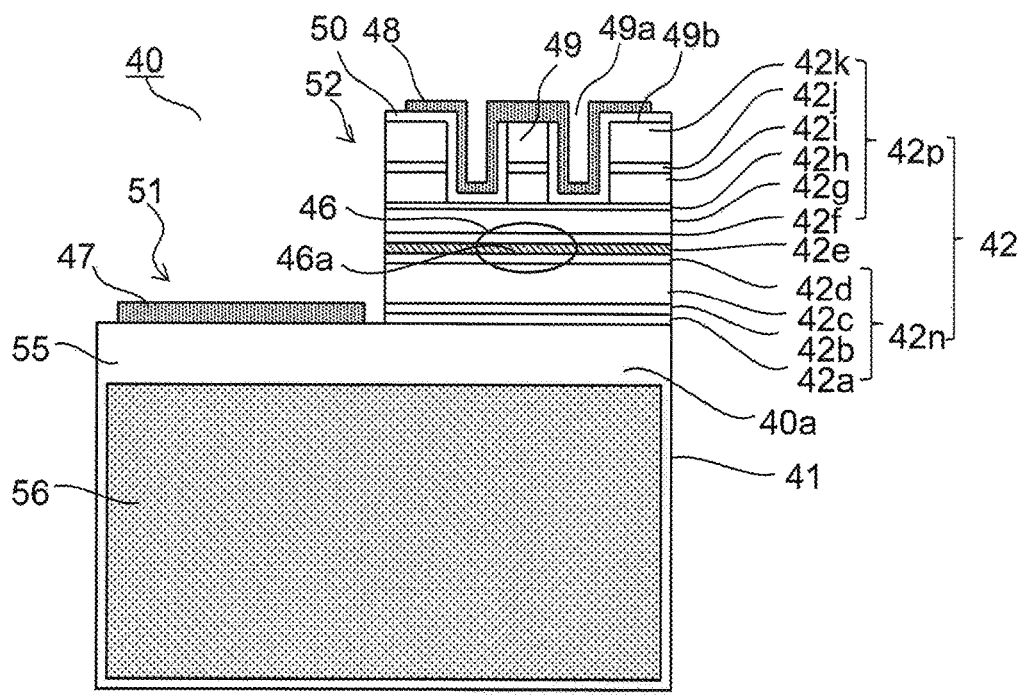
FIG. 3 is a front view showing a semiconductor laser element of the thermally-assisted magnetic recording head of the first embodiment of the present invention.
Figure 4:
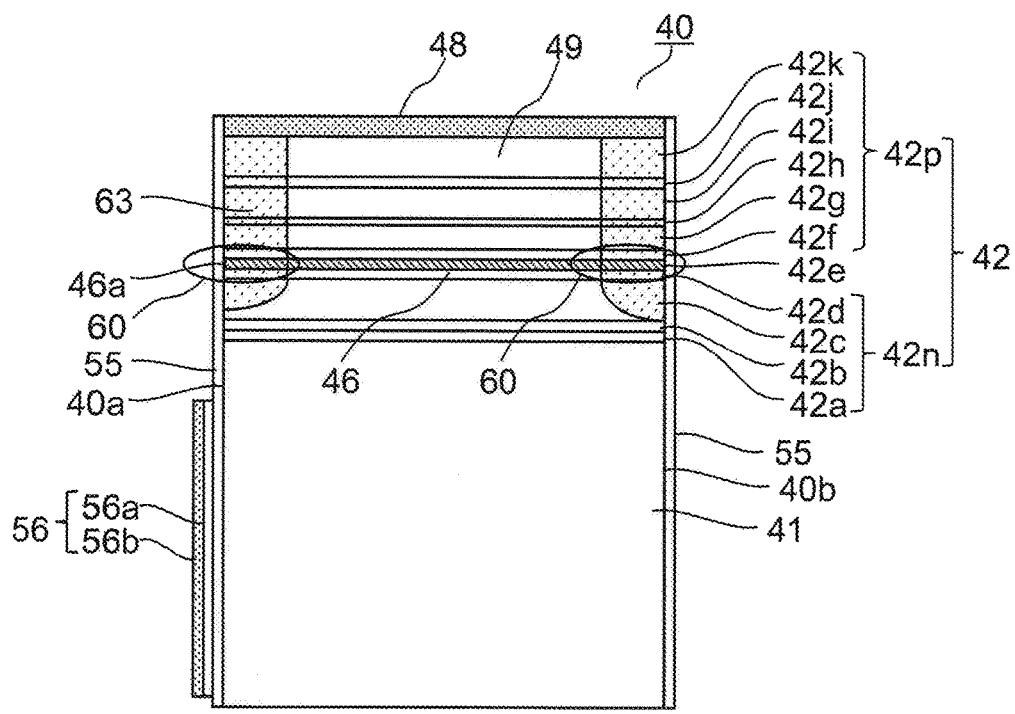
FIG. 4 is a side view showing the semiconductor laser element of the thermally-assisted magnetic recording head of the first embodiment of the present invention.

FIG. 3 is a front view of the semiconductor laser element 40, and FIG. 4 is a side sectional view of the semiconductor laser element 40 taken along a line passing over the ridge portion 49. The semiconductor laminated film 42 is formed by stacking in order an n-type semiconductor layer 42n, an active layer 42e, and a p-type semiconductor layer 42p on the substrate 41. The dug-down portion 51 is formed by digging the semiconductor laminated film 42 down to the substrate 41 or to a middle of the n-type semiconductor layer 42n by etching, and the first electrode 47 is provided at an upper surface of the dug-down portion 51.

The ridge portion 49 provided at the light emission portion 52 is formed in a shape of a narrow stripe by being sandwiched between groove portions 49a formed on both sides of the ridge portion 49 by digging the p-type semiconductor layer 42p down to a halfway point thereof by etching. On an outward side of each of the groove portions 49a, there is provided a terrace 49b which is aligned with the ridge portion 49 in height. The terrace 49b may be omitted, but the ridge portion 49 can be protected by providing the terrace 49b.

A buried layer 50 formed of an insulating film is provided on an upper surface of the light emission portion 52 except on an upper surface of the ridge portion 49, and the second electrode 48 is provided on the upper surface of the ridge portion 49 and an upper surface of the buried layer 50. Since electric current is injected into the active layer 42e via the ridge portion 49, the optical waveguide 46 is formed in a shape of a stripe, and laser light is outputted through the emission portion 46a of the optical waveguide 46 at a facet thereof. Here, at both end portions of the optical waveguide 46 in its longitudinal direction, window portions 60 are formed by diffusion layers 63 of Zn.

Figure 5:
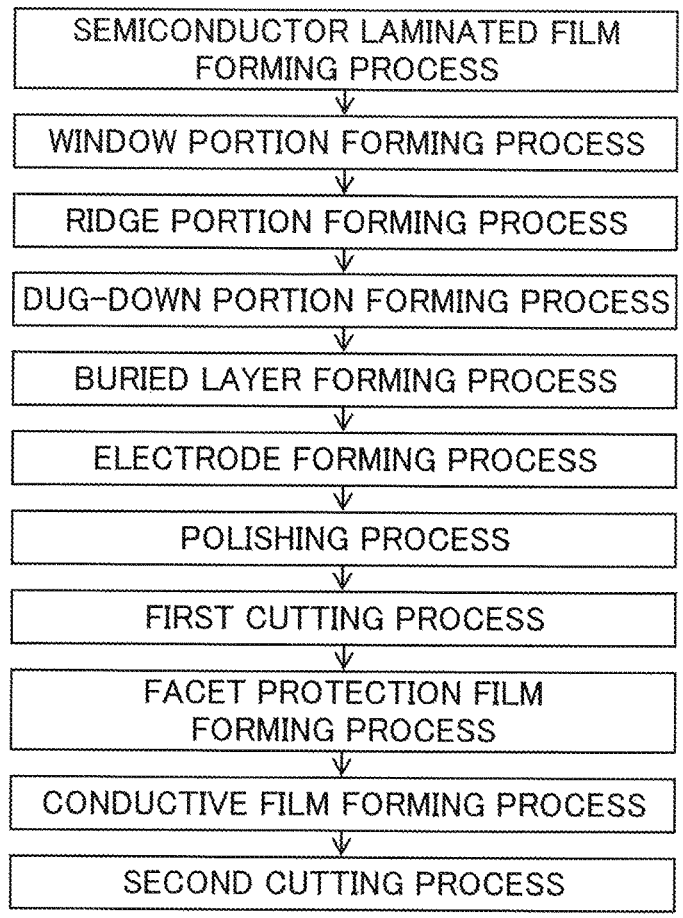
FIG. 5 is a production process chart of the semiconductor laser element of the thermally-assisted magnetic recording head of the first embodiment of the present invention.

FIG. 5 shows a production process chart of the semiconductor laser element 40. In the production process of the semiconductor laser element 40, a semiconductor laminated film forming process, a window portion forming process, a ridge portion forming process, a dug-down portion forming process, a buried layer forming process, an electrode forming process, and a polishing process are performed in order with respect to the substrate 41 (see FIG. 3) in the form of a wafer. Then, a first cutting process, a facet protection film forming process, a conductive film forming process, and a second cutting process are performed in order, so that the wafer is divided into individual semiconductor laser elements 40.

Figure 6:
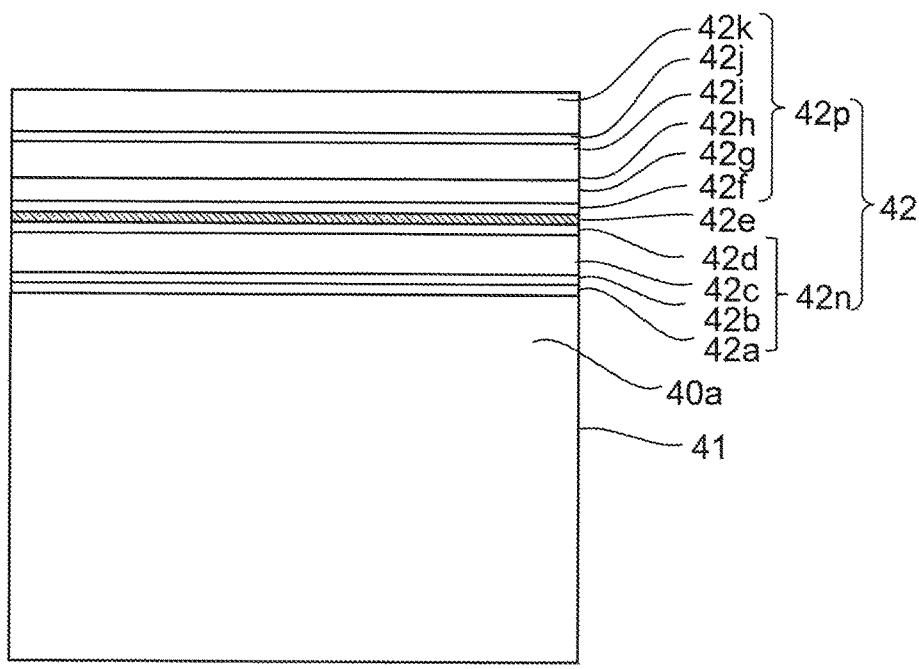
FIG. 6 is a front view for illustrating a process of forming a semiconductor laminated film of the semiconductor laser element of the thermally-assisted magnetic recording head of the first embodiment of the present invention.

FIG. 6 shows a front view for illustrating the semiconductor laminated film forming process. In the semiconductor laminated film forming process, by means of a method such as metal-organic chemical vapor deposition (MOCVD) method, a molecular beam epitaxy (MBE) method, or the like, a GaAs-based semiconductor is epitaxially grown on a base of the substrate 41 formed of GaAs, and thereby, the semiconductor laminated film 42 is formed.

Specifically, on the substrate 41, a first buffer layer 42a, a second buffer layer 42b, an n-type clad layer 42c, an n-side optical guide layer 42d, the active layer 42e, a p-side optical guide layer 42f, a first p-type clad layer 42g, an etch-stop layer 42h, a second p-type clad layer 42i, a middle layer 42j, and a contact layer 42k are epitaxially grown in order.

The first buffer layer 42a, the second buffer layer 42b, the n-type clad layer 42c, and the n-side optical guide layer 42d constitute the n-type semiconductor layer 42n which is a multilayered film. The p-side optical guide layer 42f, the first p-type clad layer 42g, the etch-stop layer 42h, the second p-type clad layer 42i, the middle layer 42j, and the contact layer 42k constitute the p-type semiconductor layer 42p as a multilayered film.

The first buffer layer 42a is formed of n-type GaAs. The second buffer layer 42b is formed of n-type GaInP. The n-type clad layer 42c is formed of n-type AlGaInP. The n-side optical guide layer 42d is formed of n-type AlGaAs. The active layer 42e is formed in a multiquantum well structure by stacking a well layer formed of GaAs and a barrier layer formed of AlGaAs.

The p-side optical guide layer 42f is formed of p-type AlGaAs. The first p-type clad layer 42g is formed of p-type AlGaInP. The etch-stop layer 42h is formed of p-type GaInP or non-doped GaInP. The second p-type clad layer 42i is formed of p-type AlGaInP. The middle layer 42j is formed of p-type GaInP. The contact layer 42k is formed of p-type GaAs. It should be noted that the stacking order of the various layers, the materials of the various layers, etc. may be changed as necessary to be most suitable according to the design of the semiconductor laser element 40.

Figure 7:
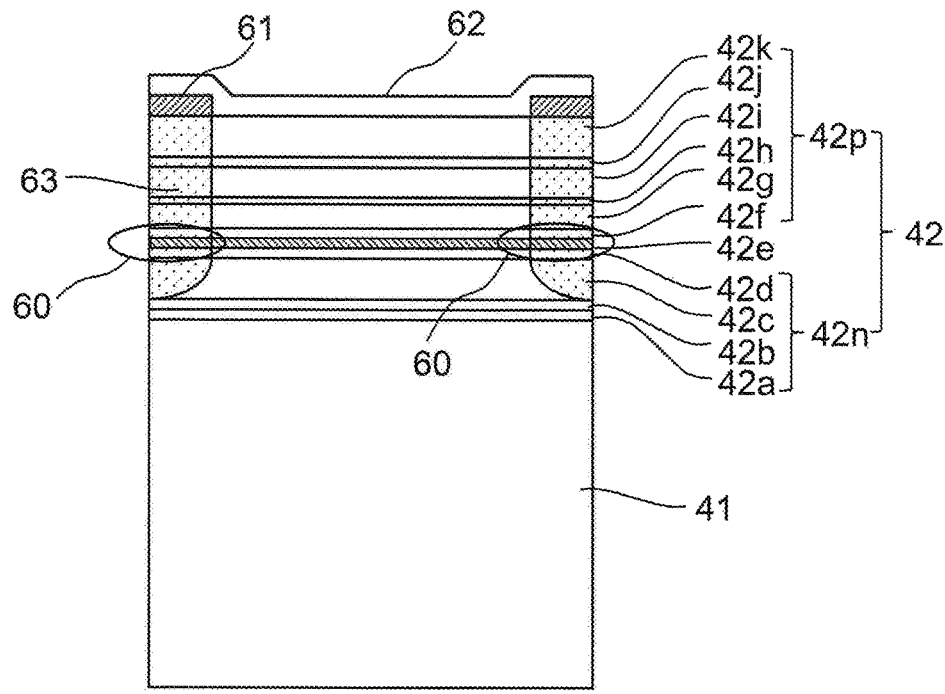
FIG. 7 is a side view for illustrating a process of forming a window portion of the semiconductor laser element of the thermally-assisted magnetic recording head of the first embodiment of the present invention.

FIG. 7 shows a side view for illustrating the window portion forming process. In the window portion forming process, a ZnO film 61 formed on the contact layer 42k by means of a plasma CVD method is removed by means of photolithography and etching, except at both end portions of the optical waveguide 46 in its longitudinal direction. Next, a protection film 62 is formed of $SiO_2$, etc. on the contact layer 42k and the ZnO film 61, and then heat treatment is performed at a temperature of 400° C. to 600° C. for 100 to 300 minutes. Thereby, Zn is diffused from the ZnO film 61 to form the diffusion layers 63, and the well layer and the barrier layer of the active layer 42e are subjected to mixed crystallization to form the window portions 60 at both end portions of the optical waveguide 46 in its longitudinal direction. Then, the protection film 62 and the ZnO film 61 are removed.

Figure 8:
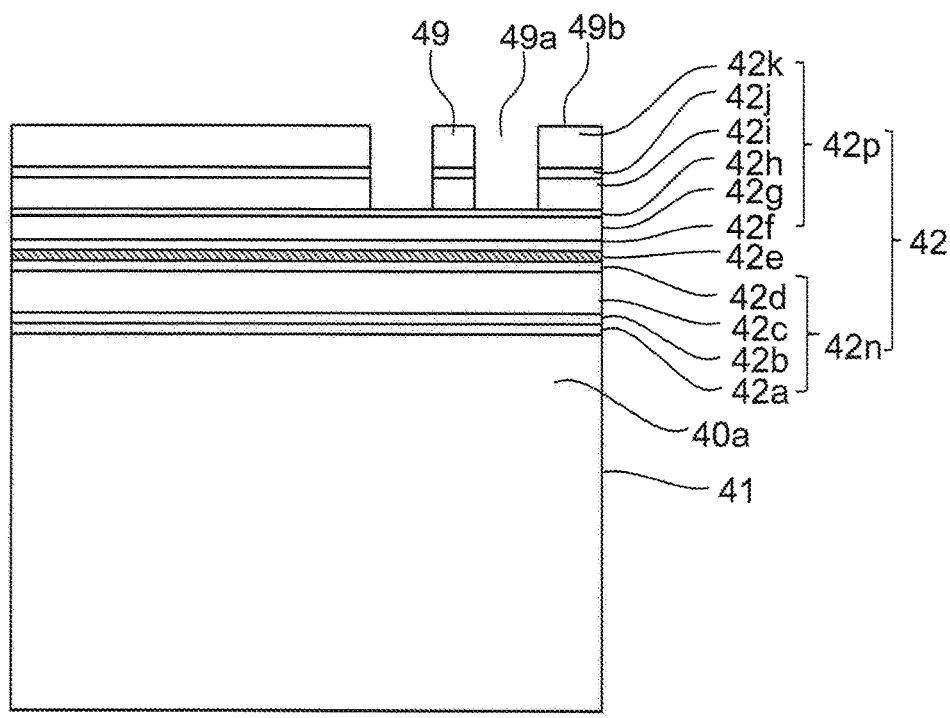
FIG. 8 is a front view for illustrating a process of forming a ridge portion of the semiconductor laser element of the thermally-assisted magnetic recording head of the first embodiment of the present invention.

FIG. 8 shows a front view for illustrating the ridge portion forming process. In the ridge portion forming process, a mask (not shown) of $SiO_2$, etc. is formed by means of photolithography in a predetermined region on the semiconductor laminated film 42. Next, by means of a method such as dry etching, wet etching, or the like, the p-type semiconductor layer 42p, which is a layer above the etch-stop layer 42g, is removed, to form the groove portions 49a, and thereafter, the mask is removed. Thereby, the ridge portion 49 having a mesa shape of narrow-width (for example, 2 μm) is formed in a shape of a stripe extending in a direction perpendicular to the emission surface 40a (see FIG. 4).

Figure 9:
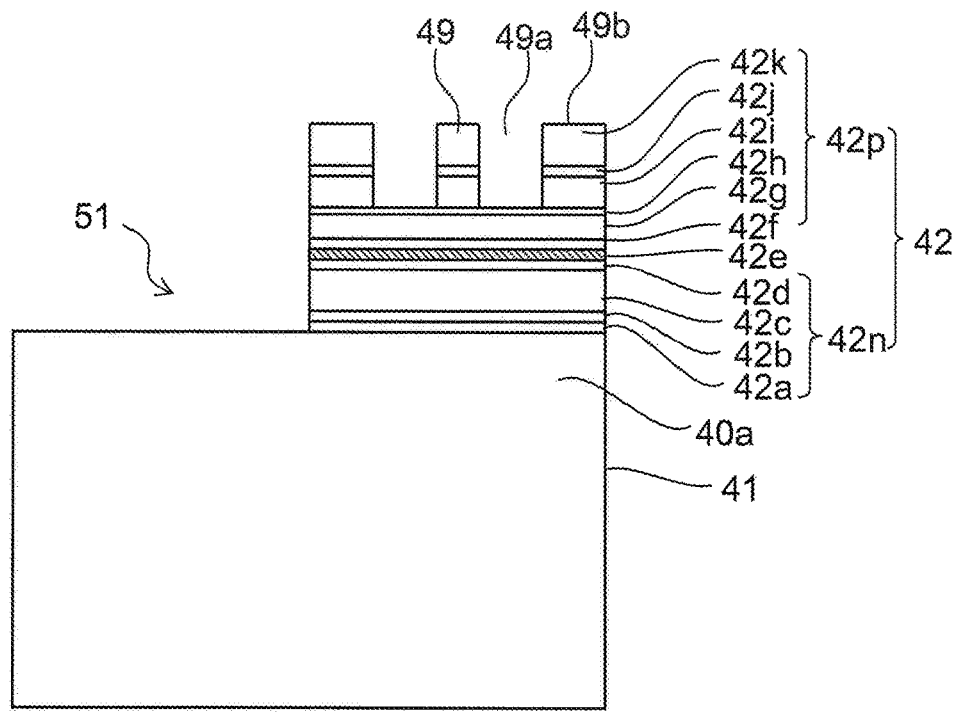
FIG. 9 is a front view for illustrating a process of forming a dug-down portion of the semiconductor laser element of the thermally-assisted magnetic recording head of the first embodiment of the present invention.

FIG. 9 shows a front view for illustrating the dug-down portion forming process. In the dug-down portion forming process, a mask (not shown) formed of $SiO_2$ is formed in a predetermined region on the semiconductor laminated film 42 by means of photolithography and etching. Next, the semiconductor laminated film 42 is dug down to an upper surface of the substrate 41 by means of a method such as dry etching, wet etching, etc. Thereby, the dug-down portion 51 is formed, and then the mask is removed. Here, instead, the dug-down portion 51 may be formed by partly removing layers disposed above the second buffer layer 42b of the semiconductor laminated film 42.

Figure 10:
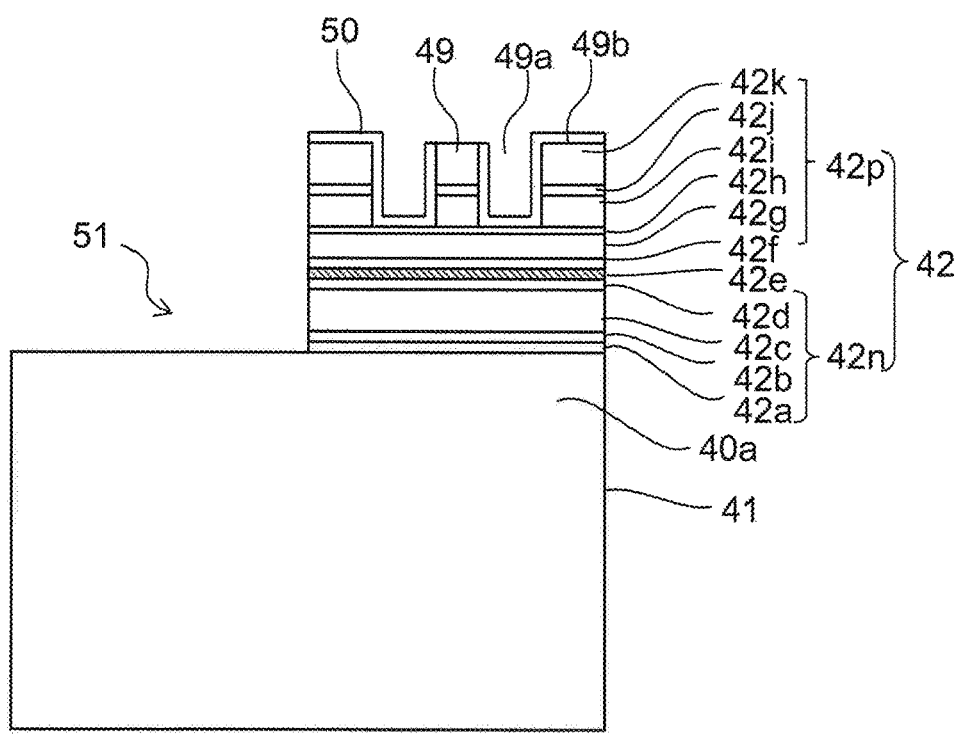
FIG. 10 is a front view for illustrating a process of forming a buried layer of the semiconductor laser element of the thermally-assisted magnetic recording head of the first embodiment of the present invention.

FIG. 10 shows a front view for illustrating the buried layer forming process. In the buried layer forming process, the buried layer 50 of $SiO_2$ is formed on an entire surface of the wafer. Next, an opening for supplying electric power is formed in the upper surface of the ridge portion 49 and in the upper surface of the dug-down portion 51 by means of photolithography and etching.

Figure 11:
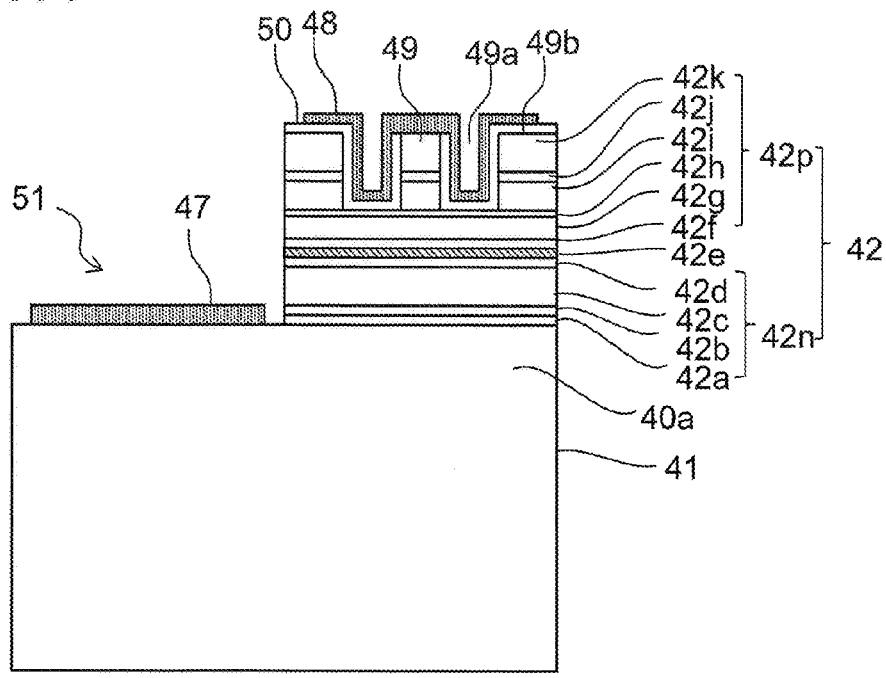
FIG. 11 is a front view for illustrating a process of forming electrodes of the semiconductor laser element of the thermally-assisted magnetic recording head of the first embodiment of the present invention.

FIG. 11 shows a front view for illustrating the electrode forming process. In the electrode forming process, a film of commonly-used ohmic metal such as AuGe/Ni, NiGe (In), or the like is formed on the entire surface of the wafer by means of a method such as sputtering, vapor deposition, or the like. Then, the first electrode 47 is formed on the upper surface of the dug-down portion 51 by means of a photolithography and etching, and annealing is performed at a temperature of about 200° C. to 450° C.

Next, by means of a method such as sputtering, vapor deposition, etc., a metal film is formed mainly of Au on the entire surface of the wafer, and then, by means of photolithography and etching, the second electrode 48 is formed on the upper surface of the ridge portion 49. Thereby, the first electrode 47 and the second electrode 48 are disposed on a surface parallel to the active layer 42e, at the side where the semiconductor laminated film 42 is formed on the substrate 41.

Through the processes described above, there is formed a semiconductor wafer of the semiconductor laser element 40 having a two-electrode-at-one-side structure where the first electrode 47 and the second electrode 48 are both disposed at one side of the substrate 41. On this semiconductor wafer, structures such as electrodes, a ridge-type waveguide, and the like can be positioned by means of photolithography. Thus, such structures can be formed with highly accurate positional relationships.

In the polishing process, a surface of the wafer forming a rear surface of the substrate 41 (the surface of the wafer opposite to the surface on which the semiconductor laminated film 42 is formed) is polished, and thereby the substrate 41 is formed to have a predetermined thickness. Since the semiconductor laser element 40 is fixed to the mounting surface 10a of the slider 10 with the emission surface 40a as a fixing surface, connection between the semiconductor laser element 40 and the substrate 41 can be enhanced by increasing the thickness of the substrate 41. For this reason, it is more desirable to form the substrate 41 to have a thickness of equal to or greater than half a length of the optical waveguide 46, or a thickness of equal to or greater than 150 μm.

In the first cutting process, scribe grooves are formed to extend in a direction perpendicular to the ridge portion 49. Next, stress is applied to the scribe grooves, to cut the semiconductor wafer by cleavage, and as a result, there are formed strip-shaped members having the emission surface 40a at one surface thereof. The semiconductor wafer may be cut by means of laser scribing, dicing, etc.

Figure 12:
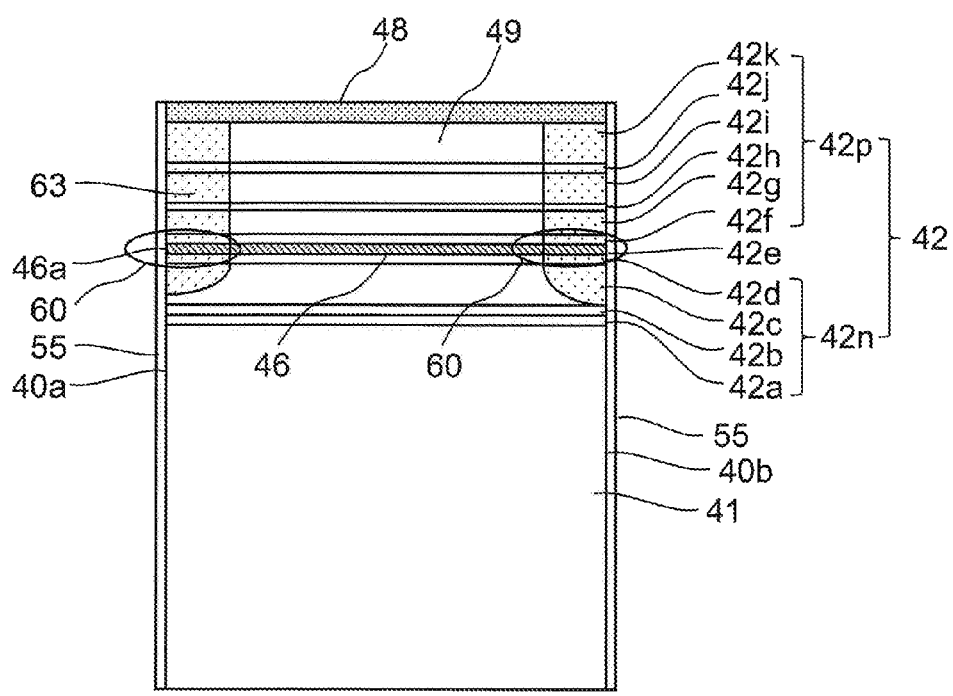
FIG. 12 is a front view for illustrating a process of forming a facet protection film of the semiconductor laser element of the thermally-assisted magnetic recording head of the first embodiment of the present invention.

FIG. 12 shows a side view for illustrating the facet protection film forming process. In the facet protection film forming process, by means of a method such as ECR sputtering, electron beam vapor deposition, etc., facet protection films 55 as insulating films are formed of $AL_2O_3$ or the like on the emission surface 40a and on an opposed surface 40b. The emission surface 40a and the opposed surface 40b are disposed opposite to each other, and are both perpendicular to the active layer 42e. The facet protection films 55 protect the facets of the semiconductor laminated film 42 and adjust reflection indices of the facets. The facet protection films 55 may be a single-layer film selected from an Si oxide film, an Al oxide film, a Ta oxide film, a Ti oxide film, a Zr oxide film, a Ga oxide film, an Si nitride film, an Al nitride film, a Ta nitride film, a Ti nitride film, a Zr nitride film, and a Ga nitride film, or the facet protection film 55 may be a multilayered film made of films selected from these films.

Next, in the conductive film forming process, the emission portion 46a is masked with a metal sheet etc., and as shown in FIG. 3 and FIG. 4 referred to above, the conductive film 56 is formed on the emission surface 40a, which is one of the surfaces on which the facet protection films 55 are formed, such that the conductive film 56 faces the substrate 41. In the present embodiment, the conductive film 56 is formed such that a base layer 56a made of Ti is disposed on the facet protection film 55 which is an insulating film, and a reaction layer 56b that is made of Au and reacts with solder is stacked on the base layer 56a. The conductive film 56 helps firmly fix the semiconductor laser element 40 to the mounting surface 10a of the slider 10 by soldering.

Here, as the conductive film 56, there may be used a single-layer film or a multilayered film formed of a material or materials selected from Pt, Ti, Ni, Co, Cr, Pd, Zr, Ta, W, Au, Mo, Ge, Ag, Cu, and ITO. At this time, the conductive film 56 may be formed by stacking a base layer 56a made of Pt, Ti, Ni, Co, Cr, Pd, or Zr, and the reaction layer 56b made of Au, in order from the substrate 41 side. By further providing a barrier layer made of Pt, Ti, Ta, or W between the base layer 56a and the reaction layer 56b, it is possible to prevent diffusion from the base layer 56a to the reaction layer 56b.

In the second cutting process, scribe grooves are formed on the strip-shaped members to extend in a direction perpendicular to the emission surface 40a, and stress is applied to the scribe grooves, to cut the strip-shaped members by cleavage. The strip-shaped members may be cut by means of laser scribing, dicing, etc. Thereby, the strip-shaped members are divided into individual semiconductor laser elements 40.

The thermally-assisted magnetic recording head 1 configured as described above is caused to float over the magnetic disk D by the slider 10, with the magnetic recording portion 13 and the magnetic reproducing portion 14 facing the magnetic disk D. When a voltage is applied between the first electrode 47 and the second electrode 48, the optical waveguide 46 forms a resonator, and laser light having an oscillation wavelength of 650 nm to 1100 nm, for example, is outputted through the emission portion 46a.

An oscillation wavelength smaller than 650 nm causes degradation in temperature characteristics of the semiconductor laser element 40. This is because an operating current density of the semiconductor laser element 40 is about two to three times larger than that of a semiconductor laser element designed for reproduction with respect to an optical disc, etc., due to a short resonator length (about 300 μm) of the semiconductor laser element 40 of the thermally-assisted magnetic recording head 1 mounted in an HDD apparatus, etc. It is also because difference in bandgap between the active layer 42e and the n-type semiconductor layer 42n or the p-type semiconductor layer 42p becomes too small to neglect the influence of overflow of carriers.

There is also a case where an InGaAs layer is used as the active layer 42e when the oscillation wavelength is equal to or greater than 850 μm. Here, when the oscillation wavelength is equal to or greater than 1100 μm, In is contained in the InGaAs layer at a large ratio, and this causes the InGaAs film to be distorted more, inviting degraded reliability of the semiconductor laser element 40.

Laser light outputted through the emission portion 46a is guided through the optical waveguide 15 of the slider 10 to reach the near-field light generating element, and causes the near-field light generating element to generate and output near-field light. An anisotropic magnetic field of the magnetic disk D is locally lowered due to heat from the near-field light, and magnetic recording is performed on the magnetic disk D by the magnetic recording portion 13. Thereby, it is possible to use a magnetic disk D having high magnetically anisotropic energy, and to improve the recording density of the magnetic disk D.

Furthermore, magnetization of the magnetic disk D is detected by the magnetic reproducing portion 14, and thereby data recorded on the magnetic disk D can be read.

Heat generated in the semiconductor laser element 40 along with generation of the laser light is transferred to the substrate 41, and thereafter, the heat is transferred to the slide 10 via the fixing member 19, which is solder or the like. Thereby, the heat is dissipated through the substrate 41 and the slider 10.

According to the present embodiment, the semiconductor laser element 40 includes the first electrode 47 and the second electrode 48 both disposed on one side with respect to the substrate 41, and the emission surface 40*a*, which is one of the two opposing facets of the substrate 41 perpendicular to the active layer 42*e*, is used as the fixing surface of the semiconductor laser element 40. Thereby, the thermally-assisted magnetic recording head 1 (near-field light output device) is formed by fixing the semiconductor laser element 40 to the slider 10 (optical member) having the near-field light generating element, without interposition of a submount or a heat sink therebetween. This facilitates the alignment of the slider 10 and the semiconductor laser element 40 with each other, and helps achieve reduced man-hours, and improved yield of, the thermally-assisted magnetic recording head 1. Moreover, the number of connection surfaces between the semiconductor laser element 40 and the slider 10 can be reduced, and thereby thermal resistance can be reduced.

Moreover, since the conductive film 56 is provided on the emission surface 40*a* which forms the fixing surface of the semiconductor laser element 40, the slider 10 and the semiconductor laser element 40 can be bonded to each other with solder, and this helps enhance the strength of connection between them.

Moreover, when the substrate 41 is formed to have a thickness that is equal to or greater than half the length between the two facets (40*a*, 40*b*) forming the optical waveguide 46 that functions as a resonator, or a thickness that is equal to or greater than 150 μm, the length of the conductive film 56 on the bonding surface becomes 100 μm or greater. Thereby, connection strength of the semiconductor laser element 40 can be improved.

Moreover, since the conductive film 56 is provided on the facet protection film 55 (insulating layer), when the slider 10 and the second electrode 48 are electrically connected to each other, the facet protection film 55 helps prevent a short circuit from occurring between the first electrode 47 and the second electrode 48. This helps improve stability of current supply in a high-frequency operation (at 5 GHz or higher, for example) where recording is performed on a minute region of the thermally-assisted magnetic recording head 1.

If the conductive film 56 is formed directly on the emission surface 40*a*, adhesion of the conductive film 56 is degraded, and a reaction occurs at an interface between the substrate 41 and the conductive film 56 to degrade quality of the conductive film 56. Thus, the facet protection film 55 (insulating film) is provided under the conductive film 56, to thereby improve the adhesion of the conductive film 56 and moderate the degradation of the quality of the conductive film 56.

Here, an insulating layer may be provided under the conductive film 56 by a process different from the facet protection film 55, but by forming the conductive film 56 on the facet protection film 55, it is possible to eliminate need of separately forming an insulating film, and thus to reduce man-hours.

Next, according to a second embodiment, a substrate 41 of a semiconductor laser element 40 of a thermally-assisted magnetic recording head 1 is different from the substrate 41 of the first embodiment. Other portions are the same as those of the first embodiment.

In the present embodiment, the substrate 41 is formed of a semi-insulating substrate made of non-doped GaAs, Si, etc. Thereby, it is possible to achieve an effect of reducing capacitance between the conductive film 56 and the n-type semiconductor layer (for example, 0.1 pF or less), in addition to the same effects as achieved in the first embodiment. Thus, it is possible to prevent degradation of insulating performance due to the capacitance between the conductive film 56 and the n-type semiconductor layer 42 during a high-frequency operation, and to further improve modulability of the operation of the semiconductor laser element 40 at a time of current modulation.

Figure 13:
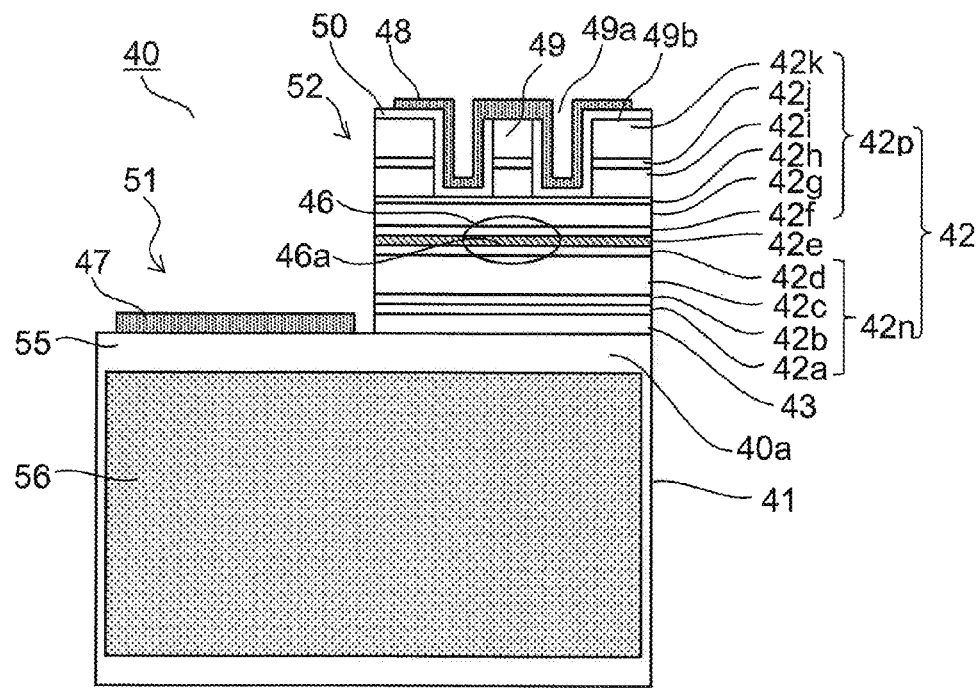
FIG. 13 is a front view showing a semiconductor laser element of a thermally-assisted magnetic recording head of a third embodiment of the present invention.

Next, FIG. 13 shows a front view of a semiconductor laser element 40 of a thermally-assisted magnetic recording head 1 of a third embodiment. For convenience of description, such portions as find their counter parts in the first embodiment illustrated in FIGS. 1 to 12 referred to above are denoted by the common reference signs. According to the present embodiment, an insulating layer 43 is formed between the substrate 41 and the n-type semiconductor layer 42*n*. Other portions are the same as those of the first embodiment.

The insulating layer 43 is formed of a semi-insulating semiconductor such as non-doped GaAs or the like to have a thickness of about 1 μm, and the insulating layer 43 is disposed between the substrate 41 and the n-type semiconductor layer 42*n*.

Thereby, it is possible to achieve an effect of reducing capacitance between the conductive film 56 and the n-type semiconductor layer (for example, 0.1 pF or less), in addition to the same effects as achieved in the first embodiment. Thus, it is possible to prevent degradation of insulating performance due to the capacitance between the conductive film 56 and the n-type semiconductor layer 42 during a high-frequency operation, and to further improve modulability of the operation of the semiconductor laser element 40 at a time of current modulation.

The insulating layer 43 may be formed of a laminated film formed by alternately stacking an n-type conductor and a p-type semiconductor. Or, the insulating layer 43 may be formed of a laminated film formed by alternately stacking a non-doped semi-insulating semiconductor and an n-type semiconductor or a p-type semiconductor. Or, the insulating layer 43 may be formed of a laminated film formed by alternately stacking an n-type semiconductor, a semi-insulating semiconductor, and a p-type semiconductor. With these laminated films, it is possible to form the insulating layer 43 as a thin film (about 0.5 μm thick, for example), and this helps shorten crystal growth time as compared with a case where the insulating layer 43 is formed as a single layer of semi-insulating semiconductor.

Or, the insulating layer 43 may be formed by doping a surface of the substrate 41 formed of n-type GaAs with an impurity such as Fe, Cr, etc., to make the surface semi-insulating.

The semiconductor laminated film 42 of the semiconductor laser element 40 of the first embodiment is formed of the n-type semiconductor layer 42*n*, the active layer 42*e*, and the p-type semiconductor layer 42*p*, which are stacked in order from the substrate 41 side. In contrast, in a semiconductor laser element 40 of the fourth embodiment, a semiconductor laminated film 42 is formed by stacking the p-type semiconductor layer 42p, the active layer 42e, and the n-type semiconductor layer 42n one on another in this order from the substrate 41. Thereby, the same effects as achieved in the first embodiment can be achieved.

That is, the semiconductor laminated film 42 may be formed by stacking a first conductive semiconductor layer, an active layer 42e, and a second conductive semiconductor layer one on another in order on the substrate 41. The semiconductor laminated films 42 of the semiconductor laser elements 40 of the thermally-assisted magnetic recording heads 1 of the second and third embodiments may be formed in the same manner as in the present embodiment.

The semiconductor laser element 40 of the thermally-assisted magnetic recording head 1 of the first embodiment is of a ridge-type having the stripe-shaped ridge portion 49. In contrast, the semiconductor laser element 40 of the fifth embodiment is of an inner stripe-type or a BH (Buried Heterostructure)-type. With this structure as well, the same effects as obtained in the first embodiment can be obtained.

That is, the semiconductor laser element 40 may be such that the optical waveguide 46 is formed in a stripe shape by the active layer 42e. The semiconductor laser elements 40 of the thermally-assisted magnetic recording heads 1 of the second to fourth embodiments may be formed in the same manner as in the present embodiment.

The descriptions of the first to fifth embodiments have dealt with thermally-assisted magnetic recording heads 1 that output near-field light, but instead, the present invention may be applied to near-field light output devices for other usages, such as minute processing, which is formed by bonding the semiconductor laser element 40 to an optical member provided with a near-field light generating element and outputs near-field light.

The present invention is applicable to near-field light output devices that output near-field light which are used in the fields of laser processing, large-capacity storage, etc.

LIST OF REFERENCE SIGNS 1 thermally-assisted magnetic recording head
7, 8 lead wire
10 slider
13 magnetic recording portion
14 magnetic reproducing portion
15 optical waveguide
17, 18 terminal
19 fixing member
21 submount
21a front surface
21b vertical surface
29 solder material
40 semiconductor laser element
40a emission surface
41 substrate
42 semiconductor laminated film
42e active layer
42n n-type semiconductor layer
42p p-type semiconductor layer
43 insulating layer
46 optical waveguide
46a emission portion
47 first electrode
48 second electrode
49 ridge portion
50 buried layer
51 dug-down portion
52 light emission portion
55 facet protection film
56 conductive film
60 window portion
D magnetic disk

The invention claimed is:

1. A semiconductor laser element, comprising:
a substrate formed of a semiconductor;
a semiconductor laminated film that is laid on the substrate and includes an active layer,
a first electrode and a second electrode that are provided on a surface parallel to the active layer, at a side where the semiconductor laminated film is formed on the substrate; and
a facet protection film that is provided on each of two facets which are located opposite to each other and which are both perpendicular to the active layer,
wherein
one of the facets on each of which the facet protection film is formed is used as a fixing surface of the semiconductor laser element.

2. The semiconductor laser element of claim 1, wherein
a conductive film is disposed on the fixing surface.

3. The semiconductor laser element of claim 2, wherein
the conductive film is formed by stacking in order a base layer, a barrier layer, and a reaction layer.

4. The semiconductor laser element of claim 1, wherein
an oscillation wavelength is 650 nm to 1100 nm.

5. The semiconductor laser element of claim 1, wherein
the substrate has a thickness that is equal to or greater than half a length between the two facets, or a thickness that is equal to or greater than 150 µm.

6. The semiconductor laser element of claim 2, wherein
the semiconductor laminated film is formed by stacking in order a first conductive semiconductor layer, the active layer, and a second conductive semiconductor layer; and
an insulating film and the conductive film are stacked on the substrate.

7. The semiconductor laser element of claim 6, wherein
the substrate is a semi-insulating substrate.

8. The semiconductor laser element of claim 6, wherein
an insulating layer is provided between the substrate and the first conductive semiconductor layer.

9. The semiconductor laser element of claim 6, wherein
the insulating film is formed with the facet protection film.

10. A near-field light output device, comprising:
the semiconductor laser element of claim 1; and
an optical member having a near-field light generating element that generates near-field light,
wherein
the fixing surface is fixed to the optical member.

11. The semiconductor laser element according to claim 3, wherein the semiconductor laminated film is formed by stacking in order a first conductive semiconductor layer, the active layer, and a second conductive semiconductor layer; and an insulating film and the conductive film are stacked on the substrate.

12. The semiconductor laser element according to claim 11,
wherein
the substrate is a semi-insulating substrate.

13. The semiconductor laser element according to claim 11,
wherein
an insulating layer is provided between the substrate and the first conductive semiconductor layer.

14. The semiconductor laser element according to claim 11,
wherein
the insulating film is formed with the facet protection film.

* * * * *